United States Patent [19]

Theus et al.

[11] Patent Number: 4,801,819
[45] Date of Patent: Jan. 31, 1989

[54] CLOCKED CMOS CIRCUIT WITH AT LEAST ONE CMOS SWITCH

[75] Inventors: Ulrich Theus, Gundelfingen; Hans-Josef Orben, Heuweiler, both of Fed. Rep. of Germany

[73] Assignee: Deutsche ITT Industries GmbH, Freiburg, Fed. Rep. of Germany

[21] Appl. No.: 67,571

[22] Filed: Jun. 29, 1987

[30] Foreign Application Priority Data

Jul. 9, 1986 [EP] European Pat. Off. ........ 86109362.3

[51] Int. Cl.$^4$ ............... H03K 3/356; H03K 3/013; H03K 17/687; H03K 17/693
[52] U.S. Cl. ............................ 307/269; 307/583; 307/585; 307/279; 307/247.1
[58] Field of Search ............ 307/269, 247 R, 279, 307/469, 480, 481, 579, 585, 452, 453, 576, 583

[56] References Cited

U.S. PATENT DOCUMENTS

| | | | |
|---|---|---|---|
| 3,457,435 | 7/1969 | Burns et al. | 307/585 |
| 3,986,046 | 10/1976 | Wunner | 307/481 |
| 4,001,606 | 6/1977 | Dingwall | 307/576 |
| 4,004,170 | 1/1977 | Henke | 307/247.1 |
| 4,450,371 | 5/1984 | Bismarck | 307/264 |
| 4,456,837 | 6/1984 | Schade, Jr. | 307/269 |
| 4,472,645 | 9/1984 | White | 307/279 |
| 4,508,983 | 4/1985 | Allgood | 307/577 |
| 4,567,385 | 1/1986 | Falater et al. | 307/469 |
| 4,611,135 | 9/1986 | Nakayama et al. | 307/585 |
| 4,717,848 | 1/1988 | Rabaey et al. | 307/263 |

FOREIGN PATENT DOCUMENTS 0115834  8/1984  European Pat. Off. ............ 307/443

OTHER PUBLICATIONS

IEEE Journal of Solid-State Circuits-"GaAs Digital Dynamic IC's for Applications up to 10 GHz"-Rocchi and Gabillard, pp. 369-376 Patent Abstracts of Japan--vol. 7, No. 133, Nov. 1978, Mitsubishi Denki K.K.
IEEE Transactions on Acoustics, Speech, & Signal Processing-"Optimal Choice of Intermediate Latching to Maximize Throughput in VLSI Circuits", pp. 28-33.
IEEE Journal of Solid-State Circuits, vol. SC-118-"-NORA: A Racefree Dynamic CMOS Technique for Pipelined Logic Structures"-Goncalves & De Man, pp. 261-266.
Patent Abstracts of Japan-vol. 7, No. 166-Hitache Seisakusho K.K.-Jul. 12, 1983.
Patent Abstracts of Japan-vol. 7, No. 111-May 14, 1983-Epuson, K.K.

Primary Examiner—Stanley D. Miller
Assistant Examiner—Tai Van Duong
Attorney, Agent, or Firm—Thomas L. Peterson

[57] ABSTRACT

To avoid interference signals caused by overlapping edges of a switching signal for driving p-channel-transistor/n-channel-transistor pairs, a drive circuit contains a first series combination of the current paths of a first p-channel transistor, a first n-switching transistor, and a first n-channel transistor and a second series combination of a second p-channel transistor, a second n-switching transistor and a second n-channel transistor, with the gate of the first p-channel transistor connected to the current-path junction of the second series combination, and the gate of the second p-channel transistor connected to the current-path junction of the first series combination. The switching signal and the inverse thereof are applied to the gates of the first n-channel transistor and the second n-channel transistor, respectively. The gates of the n-switching transistors are presented with the n-clock. The first and second current-path junctions are followed by a first inverter and a second inverter, respectively. If the transistor pair is to be turned on by the L or H level of the switching signal, the gate of the n-channel transistor of the pair is connected to the first current-path junction or the second current-path junction, respectively, and the gate of the p-channel transistor to the output of the first inverter or the second inverter, respectively.

6 Claims, 2 Drawing Sheets

4,801,819

CLOCKED CMOS CIRCUIT WITH AT LEAST ONE CMOS SWITCH

BACKGROUND OF THE INVENTION

The present invention relates to a clocked CMOS circuit wherein the gates of p- and n-channel switching transistors ("n- and p-switching transistors") and/or the gates of at least one n-channel-/p-channel-transistor pair used as a CMOS switch ("transistor pair") are each supplied with one of two mutually inverse clock signals ("n-clock and p-clock").

As is well known (e.g., as disclosed in U.S. Pat. No. 3,457,435), the simplest CMOS switch of this kind is the CMOS transmission gate, in which the controlled current paths of the two transistors of the transistor path are connected in parallel, and in which, to bias the two transistors on and off, the n-clock is applied to the gate of the n-channel transistor, and the p-clock to the gate of the p-channel transistor.

An exemplary clocked CMOS circuit is disclosed in European Patent Application EP-A 115 834, particularly in FIGS. 2c, 3a, 3b, 3f, and 3g in accordance with the description on pages 4 to 8. According to that description, a clock race problem occurs in such CMOS circuits, i.e., a condition in which useful signals are switched at a rate higher than the clock rate, which is due to the overlap of the edges of the clock signals. In the above-referenced European Patent Application, a solution to this problem is seen in a clocked CMOS circuit in which the individual subcircuits, particularly logic gates, are specifically designed with a view to eliminating clock races. The inventors have discovered that the edge overlap also results in short interference pulses at the outputs of the transistor pairs which may simulate useful signals. This is disadvantageous particularly if several such pairs are combined to form a switching network, e.g., by connecting the controlled current paths of several n-channel transistors in series to form a first series combination, by connecting the controlled current paths of the same number of p-channel transistors in series to form a second series combination, and by connecting the two series combinations in parallel.

The object of the invention as claimed is to avoid such interference pulses.

SUMMARY OF THE INVENTION

According to the invention, a distinction is made as to whether the transistor pair is to be rendered conducting by the high ("H") level or the low ("L") level of the switching signal. Based on this distinction, the fundamental idea of the invention consists in the provision of separate branches for the two switchingsignal levels to generate the clock signals and apply them to the CMOS switches, such that in both cases, the edge overlap occurs only in the OFF state of the transistors of the respective transistor pair.

BRIEF DESCRIPTION OF THE DRAWINGS

The invention will now be explained in more detail with reference to the accompanying drawings, in which.

DETAILED DESCRIPTION OF SEVERAL PREFERRED EMBODIMENTS

Figure 1:
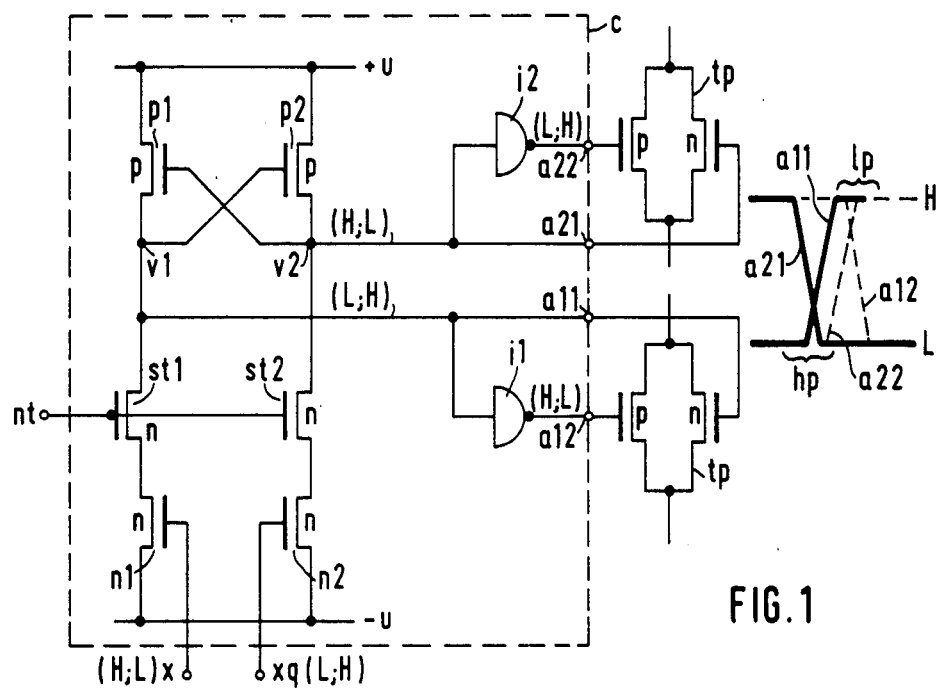
FIG. 1 is a circuit diagram of an embodiment of the invention.

The circuit diagram of the embodiment of FIG. 1 shows the drive circuit c for the two transistor pairs tp, which have been drawn as the above-mentioned CMOS transmission gates. The top transistor pair is rendered conducting by the H level of the switching signal x, and the bottom transistor pair by the L level. The levels of the switching signal are given in parentheses at the respective points of the circuit by the corresponding capital letters. The signal value assigned to the H level is given first, and the signal value assigned to the L level is given after the semicolon, as in the case of the switching signal x. Since a p-channel transistor is rendered conducting by an L level, and an n-channel transistor by an H level, the H level of the switching signal x, with which the L level of the inverse switching signal xq is associated, will turn on the two transistors of the top transistor pair tp, because an L level is applied from the output a22 of the drive circuit c to the gate of the p channel transistor, while an H level is applied from the output a21 to the gate of the n-channel transistor; at the two outputs a21, a22, the H drive-signal pair hp is thus provided.

The reverse is true for the bottom transistor pair tp, which is rendered conducting by the L level of the switching signal x, because an L level is applied from the output a12 of the drive circuit to the gate of the p-channel transistor, while an H level is applied from the output a11 to the gate of the n-channel transistor; at the two outputs a11, a12, the L drive-signal pair lp is thus provided.

In FIG. 1, the shapes of the respective drive-signal pairs hp, lp for the two levels of the switching signal x are shown schematically on the right of the two transistor pairs tp for a switching-signal transition from H to L, it being assumed that the bottom transistor pair tp is rendered conducting by this transition; this (new) state thus corresponds to the curve portions located on the right of the crossings of the respective edges. It can be seen that the edge overlap occurs already at an instant at which the respective amplitude of the two control signals of a pair is still so large that each transistor of each transistor pair tp is fully off. If the top transistor pair tp were connected to the outputs a11, a12 like the bottom pair, both transistors would be on for a short time and, thus, make possible an interference pulse because the edge-crossing point during an H-to-L transition of the switching signal x would lie near the L level.

In the embodiment of FIG. 1, the construction of the drive circuit c is as follows. Two series combinations of a p-channel transistor, a n-switching transistor, and an n-channel transistor are interposed between the positive terminal +u and the negative terminal −u of the supply-voltage source. In one of the series combinations, these are the first p-channel transistor p1, the first n-switching transistor st1, and the first n-channel transistor n1; in the other series combination, these are the second p-channel transistor p2, the second n-switching transistor st2, and the second n-channel transistor n2. The gate of the first p-channel transistor p1 is connected to the current-path junction of the second p-channel transistor p2 and the second n-switching transistor st2 (hereinafter referred to as "current-path junction v2"), and the gate of the second p-channel transistor p2 is connected to the correspondingly designated first current-path junction v1 of the first p-channel transistor p1 and the first n-switching transistor st1. The gates of the n-switching transistors st1, st2 are fed with the n-clock nt. This is one of the two mutually inverse clock signals commonly used in clocked CMOS circuits, cf. the EP-A referred to above.

The gate of the first n-channel transistor n1 is presented with the binary switching signal x, and that of the second n-channel transistor n2 with the switching signal inverted with respect thereto, xq. The first and second current-path junctions v1, v2 are followed by the first inverter i1 and the second inverter i2, respectively, which have their outputs connected to the outputs a12 and a22, respectively, of the drive circuit c, while the outputs a11 and a21 are connected directly to the first current-path junction v1 and the second current-path junction v2, respectively.

When the n-clock is at an H level, the first n-channel transistor n1 is rendered conducting by an H level of the switching signal x, and the second n-channel transistor n2 is simultaneously cut off by the inverse L level of the inverse switching signal xq. When the switching signal x goes to an L level, and the inverse switching signal xq to an H level, the situation is reversed.

Figure 2:
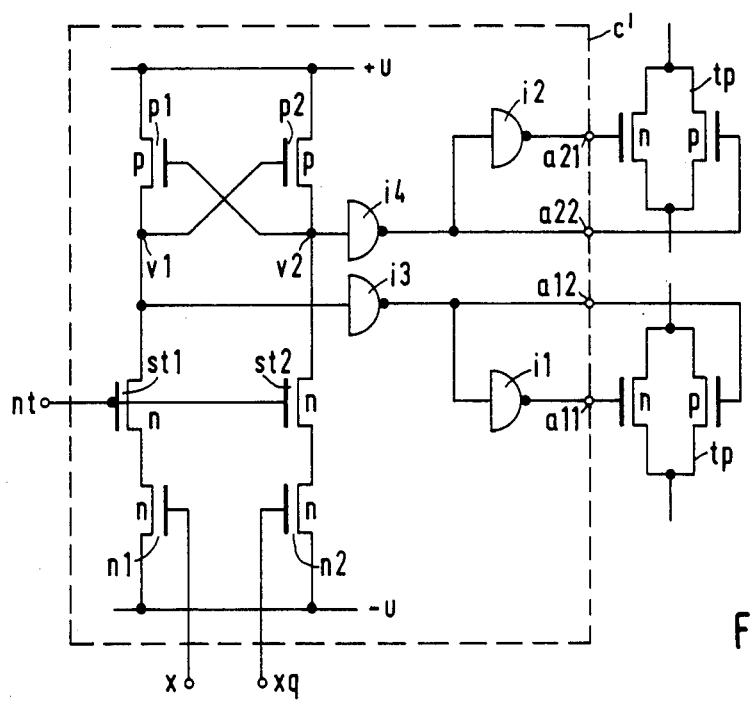
FIG. 2 is a circuit diagram of another embodiment of the invention.

FIG. 2 shows the circuit diagram of a preferred embodiment of the invention in which the drive circuit c' has two additional inverters, i3 and i4. If several, if not many transistor pairs tp are to be driven with the drive circuit c of FIG. 1, the drive circuit c must be able to charge the many gate capacitances of those transistor pairs sufficiently fast. This requires that the output stages of drive circuits necessary for this purpose occupy a correspondingly large area in the layout of the integrated circuit, as is well known. In FIG. 2, this is achieved by connecting the third inverter i3 and the fourth inverter i4 ahead of the first inverter i1 and the second inverter i2, respectively. Instead of the first current-path junction v1, the output of the inverter i3 drives the p-channel transistor of the bottom transistor pair tp and the first inverter i1, and instead of the second current-path junction v2, the output of the inverter i4 drives the p-channel transistor of the top transistor pair tp and the inverter i2. The areas of the four inverters are chosen in accordance with the load capacitance to be driven. The other parts of the drive circuit c' of FIG. 2 are identical with those of the drive circuit c of FIG. 1.

Figure 3:
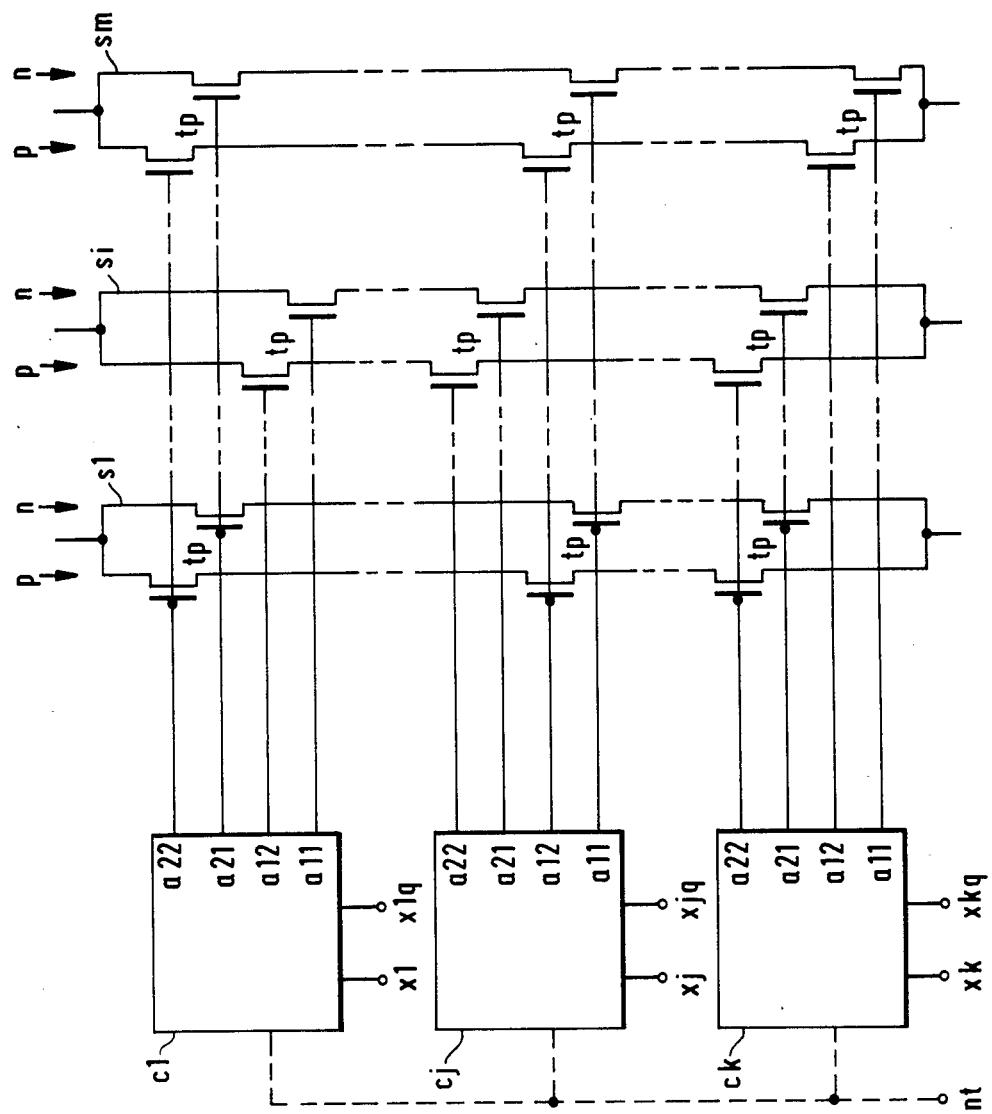
FIG. 3 is a schematic circuit diagram of a further embodiment of the invention for several switching signals and transistor pairs.

FIG. 3 shows a highly schematic diagram of an arrangement which renders a maximum of $2^k = m$ electronic switches sl ... si ... sm conducting by means of k binary switching signals xl ... xj ... xk. Each of the k binary switching signals is applied to one of k drive circuits cl ... cj ... ck, which may be of the same design as any of the arrangements of FIGS. 1 to 2; this is also indicated by the input line for the n-clock nt, which is shown as a broken line.

Of the maximum possible number m of electronic switches, the switches sl, si and sm are shown in FIG. 3. Each of them consists of the first series combination of the controlled current paths of k p-channel transistors and the second series combination of the controlled current paths of k n-channel transistors, which two series combinations are connected in parallel and are interposed between the input and the output of the electronic switch. Every two associated n- and p-channel transistors of the same index form a transistor pair tp. Depending on which binary level of the associated switching signal xl ... xj ... xk, xlq ... xjq ... xkq is to render the transistors of the respective transistor pair conducting, the gates of the p-channel transistors are connected to the output a12 or a22 of the respective drive circuit, and those of the n-channel transistors to the output a11 or a21. In the electronic switch sl, for example, the gates of the first and last p-channel transistors are connected to the first outputs a22 of the first drive circuit cl and the last drive circuit ck, respectively, while the gate of the j-th p-channel transistor is connected to the output a12 of the drive circuit cj. Consequently, the gates of the associated n-channel transistors are connected to the outputs a21 of the drive circuits cl, ck and to the output a11 of the drive circuit cj.

In the electronic switch si, the gate of the first p-channel transistor is connected to the output a12 of the drive circuit cl, while the gate of the j-th and last p-channel transistors are connected to the outputs a22 of the drive circuits cj and ck, respectively. Correspondingly, the gate of the first n-channel transistor is connected to the output a11 of the drive circuit cl, and the gates of the j-th and last n-channel transistors are connected to the outputs a21 of the drive circuits cj and ck, respectively.

In the last electronic switch sm, the first transistor pair is associated with the outputs a21, a22 of the drive circuit cl, whereas the j-th and last transistor pairs are associated with the outputs a11 and a12 of the drive circuits cj and ck, respectively.

The arrangement of FIG. 3 can be used, for example, as a data selector which permits a selection to be made from m bits of a data signal in dependence upon the k bits of the switching signal. Since, in the present invention, the drive signals for the gates of the transistors of the transistor pair are generated separately for each of the two levels of the switching signals such that an overlap occurs only in the inactive region of the transistors, no interference pulses result even in arrangements with a large number of transistor pairs, such as that of FIG. 3, as would be the case if the same drive signals for the transistor pairs were used for both levels of the switching signal.

The CMOS circuit in accordance with the invention will, of course, be implemented within integrated circuits, as is generally the case with CMOS circuits.

What is claimed is:

1. A clocked CMOS circuit comprising:
   first and second switches, each comprising a p-channel transistor and an n-channel transistor connected in parallel; and
   a drive circuit coupled to said switches that produces a first pair of drive signals for said first switch and a second pair of drive signals for said second switch, each of said pairs of drive signals including a first drive signal for controlling said n-channel transistor in the respective switch and a second drive signal for controlling said p-channel switch in the respective switch, said first drive signal in each pair of drive signals being inverse to said second drive signal in each pair of drive signals, said first drive signal in said first pair of drive signals being inverse to said first drive signal in said second pair of drive signals and said second drive signal in said first pair of drive signals being inverse to said second drive signal in said second pair of drive signals, said drive circuit being supplied a clock signal and a first switching signal and a second switching signal inverse to said first switching signal, said n-channel transistors and said p-channel transistors in said switches being selectively rendered conducting and non-conducting by respective levels of said switching signals, said drive circuit controlling the time at which said drive signals switch from one signal level to another signal level so that the n-channel transistor in one of said first and second switches is rendered non-conducting before the n-channel transistor in the other of said first and second switches is rendered conducting and so that the p-channel transistor in said one of said first and second switches is rendered non-conducting before the p-channel transistor in said other of said first and second switches is rendered conducting.

2. A clocked CMOS circuit comprising:
first and second switches, each comprising a p-channel transistor and an nchannel transistor connected in parallel; and
a drive circuit coupled to said first and second switches for producing a first drive signal and a second drive signal, said first drive signal being inverse to said second drive signal, said drive circuit being supplied a clock signal and a first switching signal and a second switching signal inverse to said first switching signal, said first and second switches being rendered conducting by the level of said switching signals, wherein said drive circuit comprises:
a first series circuit comprising a series combination of the controlled current paths of a first p-channel transistor, a first n-switching transistor, and a first n-channel transistor;
a second series circuit comprising a series combination of the controlled current paths of a second p-channel transistor, a second n-switching transistor, and a second n-channel transistor, each of said series circuits being connected between the positive terminal and the negative terminal of a supply-voltage source;
the gate of said second p-channel transistor being connected to a first current-path junction, said first junction being the junction of said first p-channel transistor and said first n-switching transistor;
the gate of said first p-channel transistor being connected to a second current-path junction, said second junction being the junction of said second p-channel transistor and said second n-switching transistor;
the gate of said first n-channel transistor being supplied with said first switching signal, the gate of said second n-channel transistor being supplied with said second switching signal, and the gates of said n-switching transistors being supplied with said clock signal;
first and second inverters, the input of said first inverter being connected to said first current-path junction and the input of said second inverter being connected to said second current-path junction;
the gate of said n-channel transistor of one of said first and second switches being connected to one of said first and second current-path junctions and the gate of said p-channel transistor of said one of said first and second switches being connected to the output of one of said first and second inverters having its input connected to said one of said first and second current-path junctions.

3. A clocked CMOS circuit comprising:
first and second switches, each comprising a p-channel transistor and an n-channel transistor connected in parallel;
a drive circuit coupled to said first and second switches for producing a first drive signal and a second drive signal, said first drive signal being inverse to said second drive signal, said drive circuit being supplied a clock signal and a first switching signal and a second switching signal inverse to said first switching signal, said first and second switches being rendered conducting by the level of said switching signals, wherein said drive circuit comprises:
a first series circuit comprising a series combination of the controlled current paths of a first p-channel transistor, a first n-switching transistor, and a first n-channel transistor;
a second series circuit comprising a series combination of the controlled current paths of a second p-channel transistor, a second n-switching transistor, and a second n-channel transistor, each of said series circuits being connected between the positive terminal and the negative terminal of a supply-voltage source;
the gate of said second p-channel transistor being connected to a first current-path junction, said first junction being the junction of said first p-channel transistor and said first n-switching transistor;
the gate of said first p-channel transistor being connected to a second current-path junction, said second junction being the junction of said second p-channel transistor and said second n-switching transistor;
the gate of said first n-channel transistor being supplied with said first switching signal, the gate of said second n-channel transistor being supplied with said second switching signal, and the gates of said n-switching transistors being supplied with said clock signal;
first, second, third and fourth inverters, said third inverter having its input connected to said first current-path junction and its output connected to the input of said first inverter, said fourth inverter having its input connected to said second current-path junction and its output connected to the input of said second inverter, the gate of said pchannel transistor of one of said first and second switches being connected to the input of one of said first and second inverters and the gate of said n-channel transistor of said one of said first and second switches being connected to the output of said one of said first and second inverters.

4. A clocked CMOS circuit as defined in claims 2 or 3 comprising a maximum of m electronic switches whose conductance is controlled by means of k binary switching signals each of which is applied to one of k drive circuits, wherein m and k are defined by the relation $2^k = m$,
each of said electronic switches comprising two series combinations of controlled current paths of k p-channel transistors and k n-channel transistors, said two series combinations being connected in parallel between the input and the output of each of said electronic switches.

5. A clocked CMOS circuit as defined in claim 3, wherein the areas of said third and fourth inverters are chosen in accordance with the load capacitance to be driven.

6. A drive circuit for an electronic switch comprising:
a first series circuit comprising a series combination of the controlled current paths of a first p-channel transistor, a first n-switching transistor, and a first n-channel transistor;
a second series circuit comprising a series combination of the controlled current paths of a second p-channel transistor, a second n-switching transistor, and a second n-channel transistor, each of said series circuits being connected between the positive terminal and the negative terminal of a supply-voltage source; and
a first inverter and a second inverter,
the gate of said second p-channel transistor being connected to a first current-path junction, said first junction being the junction of said first p-channel transistor and said first n-switching transistor;
the gate of said first p-channel transistor being connected to a second current path junction, said second junction being the junction of said second p-channel transistor and said second n-switching transistor;
the gate of said first n-channel transistor being supplied with a first switching signal, the gate of said second n-channel transistor being supplied with a second switching signal inverse to said first switching signal, and the gates of said n-switching transistors being supplied with a clock signal; and
the input of said first inverter being connected to said first current-path junction and the input of said second inverter being connected to said second current-path junction.

* * * * *